(12) United States Patent
Zhou et al.

(10) Patent No.: US 12,027,537 B2
(45) Date of Patent: Jul. 2, 2024

(54) ARRAY SUBSTRATE, DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Da Zhou, Beijing (CN); Taoran Zhang, Beijing (CN); Zailong Mo, Beijing (CN); Linxuan Li, Beijing (CN); Wenjin Huang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 278 days.

(21) Appl. No.: 17/298,333

(22) PCT Filed: Sep. 28, 2020

(86) PCT No.: PCT/CN2020/118433
§ 371 (c)(1),
(2) Date: May 28, 2021

(87) PCT Pub. No.: WO2021/093479
PCT Pub. Date: May 20, 2021

(65) Prior Publication Data
US 2022/0115416 A1  Apr. 14, 2022

(30) Foreign Application Priority Data
Nov. 12, 2019 (CN) .......................... 201911101198.1

(51) Int. Cl.
*H01L 27/12* (2006.01)

(52) U.S. Cl.
CPC .................. *H01L 27/1255* (2013.01)

(58) Field of Classification Search
CPC ..... H01L 27/12–1296; H01L 28/40–92; H01L 27/1255; H10K 59/12; H10K 59/1216
See application file for complete search history.

(56) References Cited

U.S. PATENT DOCUMENTS 9,817,501 B2 * 11/2017 Wang ................. G06F 3/0445
2008/0067519 A1   3/2008 Sakurai et al.
(Continued)

FOREIGN PATENT DOCUMENTS

CN      101286524 A    10/2008
CN      105321983 A     2/2016
(Continued)

OTHER PUBLICATIONS

Chinese Office Action, dated Apr. 26, 2022, for CN201911101198.1 filed Jan. 6, 2022.
(Continued)

*Primary Examiner* — David Vu
(74) *Attorney, Agent, or Firm* — Workman Nydegger

(57) ABSTRACT

The present disclosure discloses an array substrate, a display panel and a display device. The array substrate includes a base substrate and a capacitor, the capacitor includes a first electrode, a dielectric portion and a second electrode sequentially located on the base substrate; wherein the dielectric portion includes: a first plane facing the second electrode, and a first slope surface extending from the first plane to the base substrate; and an orthographic projection, on the base substrate, of the second electrode is located in a region where an orthographic projection, on the base substrate, of the first plane of the dielectric portion is located.

15 Claims, 2 Drawing Sheets

(56) References Cited

U.S. PATENT DOCUMENTS

| | | |
|---|---|---|
| 2008/0246403 A1 | 10/2008 | Sagawa et al. |
| 2012/0168764 A1 | 7/2012 | Kim |
| 2015/0287741 A1 | 10/2015 | Wang et al. |
| 2016/0035810 A1 | 2/2016 | Park |
| 2017/0236949 A1* | 8/2017 | Yamazaki ......... H01L 29/78648 257/43 |
| 2017/0287952 A1 | 10/2017 | Li et al. |
| 2018/0182836 A1 | 6/2018 | Beak et al. |
| 2018/0197897 A1 | 7/2018 | Xin et al. |
| 2019/0074298 A1 | 3/2019 | Toda |

FOREIGN PATENT DOCUMENTS

| | | |
|---|---|---|
| CN | 205944094 U | 2/2017 |
| CN | 108242457 A | 7/2018 |
| CN | 108550605 A | 9/2018 |
| CN | 110018600 A | 7/2019 |
| CN | 110797353 A | 2/2020 |
| EP | 0376437 * | 8/1989 |
| KR | 20160065300 A | 6/2016 |
| KR | 20180031978 A | 3/2018 |
| TW | 200813581 A | 3/2008 |

OTHER PUBLICATIONS

Chinese Office Action, dated Aug. 24, 2021, from CN201911101198.1 filed Nov. 12, 2019.

* cited by examiner

ARRAY SUBSTRATE, DISPLAY PANEL AND DISPLAY DEVICE

CROSS-REFERENCE TO RELATED APPLICATIONS

The present disclosure is a US National Stage of International Application No. PCT/CN2020/118433, filed Sep. 28, 2020, which claims priority to the Chinese Patent Application No. 201911101198.1, filed by the China National Intellectual Property Administration on Nov. 12, 2019 and entitled "Array Substrate, Display Panel and Display Device", their entire content of which is incorporated herein by reference.

FIELD

The present disclosure relates to the field of semiconductor technology, in particular to an array substrate, a display panel and a display device.

BACKGROUND

Flat panel displays (FPDs) have become mainstream products on the market. There are more and more types of flat panel displays, such as liquid crystal displays (LCDs), organic light emitting diode (OLED) displays, plasma display panels (PDPs) and field emission displays (FEDs).

A capacitance storage (Cst) is an indispensable unit for display backplane design, but a capacitor produced in the related art may cause the problem of abnormal display of a display panel.

SUMMARY

Embodiments of the present disclosure provide an array substrate, including a capacitor, the capacitor includes a first electrode, a dielectric portion and a second electrode sequentially located on a base substrate;

the dielectric portion includes: a first plane facing the second electrode, and a first slope surface extending from the first plane to the base substrate; and an orthographic projection, on the base substrate, of the second electrode is only in a region where an orthographic projection, on the base substrate, of the first plane of the dielectric portion is located.

In a possible implementation manner, the second electrode includes: a second plane facing the dielectric portion, and a second slope surface connected to the second plane;

an slope angle formed by the second slope surface and the second plane is an acute angle; and an orthographic projection, on the base substrate, of the second plane of the second electrode is only in the region where the orthographic projection, on the base substrate, of the first plane of the dielectric portion is located.

In a possible implementation manner, an orthographic projection, on the base substrate, of the dielectric portion completely covers an orthographic projection, on the base substrate of the first electrode.

In a possible implementation manner, the first electrode includes: a third plane facing the dielectric portion; the orthographic projection, on the base substrate, of the second plane of the second electrode is only in a region where an orthographic projection, on the base substrate, of the third plane of the first electrode is located.

In a possible implementation manner, the first electrode further includes: a fourth plane facing the base substrate, and a third slope surface connected with the fourth plane and the third plane; and an included angle formed by the third slope surface and the fourth plane ranges from 50 degrees to 90 degrees.

In a possible implementation manner, the array substrate includes: a gate drive circuit, and the gate drive circuit includes the capacitor.

In a possible implementation manner, the array substrate includes: a pixel circuit, and the pixel circuit includes the capacitor.

In a possible implementation manner, the array substrate includes a first gate metal layer, a gate insulating layer and a second gate metal layer sequentially located on the base substrate;

a layer where the first electrode is located is same as a layer where the first gate metal layer is located, a layer where the dielectric portion is located is same as a layer where the gate insulating layer is located, and a layer where the second electrode is located is same as a layer where the second gate metal layer is located.

Embodiments of the present disclosure further provide a display panel, including the array substrate provided by the embodiment of the present disclosure.

Embodiments of the present disclosure further provide a display device, including the display panel provided by the embodiment of the present disclosure.

DETAILED DESCRIPTION OF THE EMBODIMENTS

In order to make the objectives, technical solutions and advantages of the embodiments of the present disclosure clearer, the technical solutions of the embodiments of the present disclosure will be described clearly and completely below in conjunction with the accompanying drawings of the embodiments of the present disclosure. Obviously, the described embodiments are a part of the embodiments of the present disclosure, but not all the embodiments. Based on the described embodiments of the present disclosure, all other embodiments obtained by those of ordinary skill in the art without creative work fall within the protection scope of the present disclosure.

Unless otherwise defined, the technical terms or scientific terms used in the present disclosure shall have the ordinary meanings understood by persons of ordinary skill in the art to which the present disclosure belongs. The words "first", "second" and similar words used in the present disclosure do not indicate any order, quantity or importance, but are only used to distinguish different components. Similar words such as "comprise" or "include" or the like mean that the elements or objects appearing before the word cover the elements or objects listed after the word and equivalents thereof, but do not exclude other elements or objects. Similar words such as "connected to" or "connected with"

are not limited to physical or mechanical connections, but may include electrical connections, whether direct or indirect. "Upper", "lower", "left", "right" and the like are only used to indicate the relative positional relationship. When the absolute position of the described object changes, the relative positional relationship may also change accordingly.

In order to keep the following description of the embodiments of the present disclosure clear and concise, detailed descriptions of known functions and known components are omitted in the present disclosure.

Figure 1:
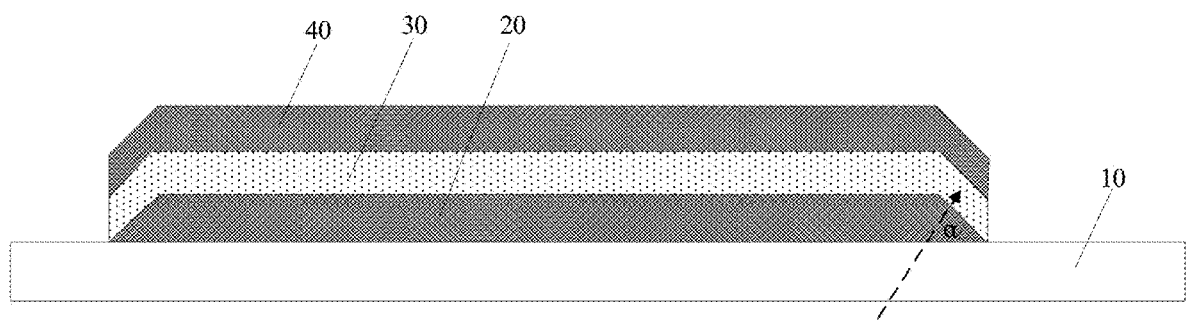
FIG. 1 is a schematic structural view of a capacitor of the related art.

It should be noted that, in the industry, as shown in FIG. 1, double-layer GAT (metal molybdenum) is widely adopted as top and bottom plates of a capacitance storage. In a conventional capacitor, an area of a second electrode 40 (top plate GAT2) is greater than an area of a first electrode 20 (bottom plate GAT1), which is a structure that the GAT2 covers the GAT1, and a dielectric portion 30 (GI1) is filled with SiNx. On a backplane circuit, GAT1 and GAT2 exist in the form of "islands" and are formed by using an SF6 dry etching process. However, with the continuous improvement of a display panel generation line, the process difficulty of uniformity in a display panel is also continuously increasing, and in some regions of the capacitor, a slope angle α of the first electrode 20 is not easily stabilized at a set value. That is, for example, α actually required to be formed is <50°, but the angle is not easily stabilized in the process, which will result in α>50°, Larger α will cause GI1 to crack (as indicated by the dashed arrow in FIG. 1). When GI1 cracks, GAT1 and GAT2 will have a risk of a short, for example, after a short between GAT1 and GAT2 of a gate drive circuit (GOA) occurs, drive abnormalities will occur, which leads to abnormal display (AD) of the display panel, thereby reducing the production yield of the display panel.

Figure 2:
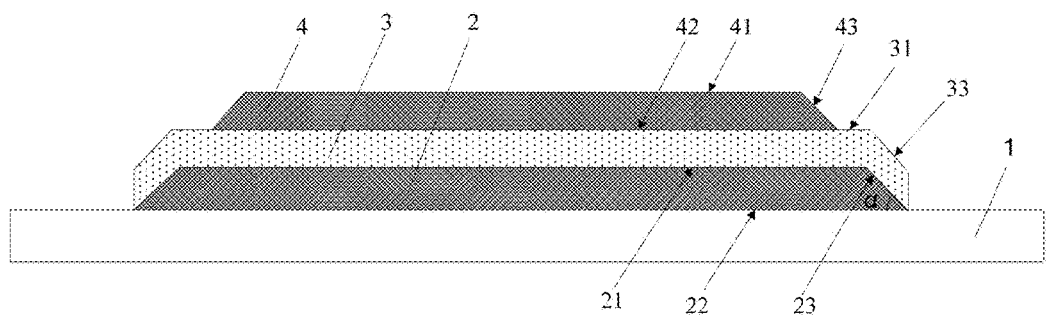
FIG. 2 is a schematic sectional structural view of the capacitor according to the embodiment of the present disclosure.
Figure 3:
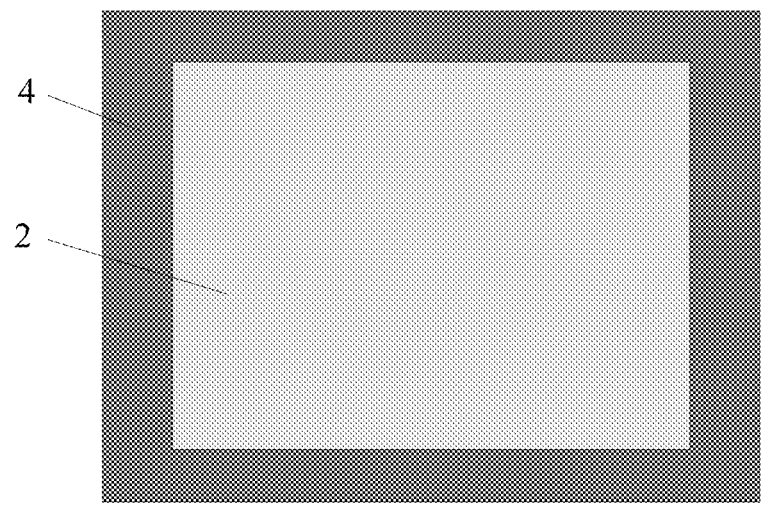
FIG. 3 is a schematic top structural view of the capacitor provided by fine embodiment of the present disclosure.

Referring to FIG. 2 and FIG. 3. Embodiments of the present disclosure provide an array substrate, including a capacitor, the capacitor includes a first electrode 2, a dielectric portion 3 and a second electrode 4 sequentially located on a base substrate 1;

the dielectric portion 3 includes: a first plane 31 facing the second electrode 4, and a first slope surface 33 extending from the first plane 31 to the base substrate 1; and an orthographic projection, on the base substrate 1, of the second electrode 4 is only in a region where an orthographic projection, on the base substrate 1, of the first plane 31 of the dielectric portion 3 is located.

The array substrate provided by the embodiments of the present disclosure include the capacitor, the capacitor includes the first electrode 2, the dielectric portion 3 and the second electrode 4 sequentially located on the base substrate 1; the dielectric portion 3 includes: the first plane 31 facing the second electrode 4, and the first slope surface 33; and the orthographic projection, on the base substrate 1, of the second electrode 4 is only in the region where the orthographic projection, on the base substrate 1, of the first plane 31 is located. That is, the slope angle α that the first electrode 2 needs to form during conventional etching is less than 50 degrees, but it is not easily ensured that the slope angle α formed by the first electrode 2 of the capacitor is less than 50 degrees in an actual production process. If the formed slope angle α is too large, the dielectric portion 3 on the first electrode 2 will crack at the first slope surface 33, while the crack of the dielectric portion 3 at the first slope surface 33 will further lead to a short between the first electrode 2 and the second electrode 4, causing abnormal display.

In the embodiments of the present disclosure, the area of the second electrode 4 is made smaller, the orthographic projection, on the base substrate 1, of the second electrode 4 is only in the region where the orthographic projection, on the base substrate 1, of the first plane 31 is located, and the range of the second electrode 4 terminates before the first slope surface 33 where the dielectric portion 3 is inclined downwards, so there will be no short between the first electrode 2 and the second electrode 4 at the first slope surface 33, thereby fundamentally relieving the problem that the capacitor produced in the related art may cause the problem of abnormal display of the display panel. Moreover, the orthographic projection, on the base substrate, of the second electrode is only in the region where the orthographic projection, on the base substrate, of the first plane is located, which may further improve a withstand voltage margin that the capacitor can withstand due to avoiding T-aging, that is, relieve the problem that a conventional capacitor can easily break down weak positions of the first electrode and the second electrode in the capacitor structure due to too high T-aging voltage, causing a limited withstand voltage margin.

In specific implementation, as shown in FIG. 2, the second electrode 4 includes: a second plane 42 facing the dielectric portion 3, and a second slope surface 43 connected to the second plane 42, an slope angle formed by the second slope surface 43 and the second plane 42 is an acute angle; and an orthographic projection, on the base substrate 1, of the second plane 42 of the second electrode 4 is only in the region where the orthographic projection, on the base substrate 1, of the first plane 31 of the dielectric portion 3 is located.

Accordingly, the second electrode 4 may further includes a second electrode top plane 41 facing away from the dielectric portion 3, and the second slope surface 43 is connected with the second electrode top plane 41 and the second plane 42.

In the embodiments of the present disclosure, the slope angle formed by the second slope surface 43 and the second plane 42 of the second electrode 4 is an acute angle, a cross section of the second electrode 4 is in the shape of a regular trapezoid, the area of the second plane 42 facing the dielectric portion 3 is greater than the area of the second electrode top plane 41 facing away from the dielectric portion 3, and therefore, when it is only required that the orthographic projection of the second plane 42 with a larger area in the second electrode 4 is in the orthographic projection of the first plane 31, it can be ensured that the entire second electrode 4 is in the orthographic projection of the first plane 31, thereby avoiding the problem of the short between the first electrode 2 and the second electrode 4.

In specific implementation, as shown in FIG. 2, an orthographic projection, on the base substrate 1, of the dielectric portion 3 completely covers an orthographic projection, on the base substrate 1, of the first electrode 2. In the embodiment of the present disclosure, the orthographic projection, on the base substrate 1, of the dielectric portion 3 completely covers the orthographic projection, on the base substrate 1, of the first electrode 2, so that the dielectric portion 3 can play a role in protecting the first electrode 2.

In specific implementation, as shown in FIG. 2, the first electrode 2 includes: a third plane 21 facing the dielectric portion 3; and the orthographic projection, on the base substrate 1, of the second plane 4 of the second electrode 42 is only in a region where an orthographic projection, on the base substrate 1, of the third plane 21 of the first electrode 2 is located. In the embodiments of the present disclosure, further, the orthographic projection, on the base substrate 1, of the second plane 42 of the second electrode 4 is only in the region where the orthographic projection, on the base substrate 1, of the third plane 21 of the first electrode 2 is located, that is, since the first slope surface 33 of the dielectric portion 3 is formed as the third slope surface 23 of the first electrode 2 is inclined downwards, in order to avoid the difficulty in determining an outer boundary of the first plane 31 of the dielectric portion 3 during production, it may be required to make the orthographic projection, on the base substrate 1, of the second plane 42 of the second electrode 4 only in the region where the orthographic projection, on the base substrate 1, of the third plane 21 of the first electrode 2 is located, thereby ensuring that the orthographic projection of the second electrode 4 is only in the region where the orthographic projection of the first plane 31 of the dielectric portion 3 is located.

In specific implementation, as shown in FIG. 2, the first electrode 2 further includes: a fourth plane 22 facing the base substrate 1, and a third slope surface 23 connected with the fourth plane 22 and the third plane 21; and an included angle formed by the third slope surface 23 and the fourth plane 22 ranges from 50 degrees to 90 degrees. In the embodiments of the present disclosure, the slope angle of the first electrode 2 ranges from 50 degrees to 90 degrees, that is, for the capacitor that easily cracks at the first slope surface 33 of the dielectric portion 3, the embodiments of the present disclosure provide a capacitor structure by which the problem of the short between the first electrode 2 and the second electrode 4 can be well avoided. Of course, in the embodiments of the present disclosure, the slope angle of the first electrode 2 may also be other acute angles.

In specific implementation, the array substrate includes: a gate drive circuit, and the gate drive circuit includes the capacitor. That is, the capacitor in the embodiments of the present disclosure may be the capacitor in the gate drive circuit.

In specific implementation, the array substrate includes: a pixel circuit, and the pixel circuit includes the capacitor. That is, the capacitor in the embodiments of the present disclosure may also be the capacitor in the pixel circuit.

In specific implementation, the array substrate includes a first gate metal layer, a gate insulating layer and a second gate metal layer sequentially located on the base substrate;
a layer where the first electrode is located is same as a layer where the first gate metal layer is located, a layer where the dielectric portion is located is same as a layer where the gate insulating layer is located, and a layer where the second electrode is located is same as a layer where the second gate metal layer is located.

In the embodiments of the present disclosure, being located on the same layer generally refers to being prepared by using the same patterning process. Herein, the same patterning process means that the same film forming process is used to form a film layer for forming a specific pattern, and then, the same mask is used to form a layer structure by a single patterning process. It should be noted that depending on different specific patterns, the single patterning process may include multiple exposure, development or etching processes, while the specific patterns in the formed layer structure may be continuous or discontinuous. These specific patterns may also be at different heights or have different thicknesses. In specific implementation, the dielectric portions of the capacitors may be of an integral structure.

Embodiments of the present disclosure further provide a display panel, including the array substrate provided by the embodiments of the present disclosure. In specific implementation, the display panel in the embodiments of the present disclosure may be an OLED display panel.

Embodiments of the present disclosure further provide a display device, including the display panel provided by the embodiment of the present disclosure.

In specific implementation, the cause of a non-display problem of the display panel may be found by the following steps.

Figure 4:
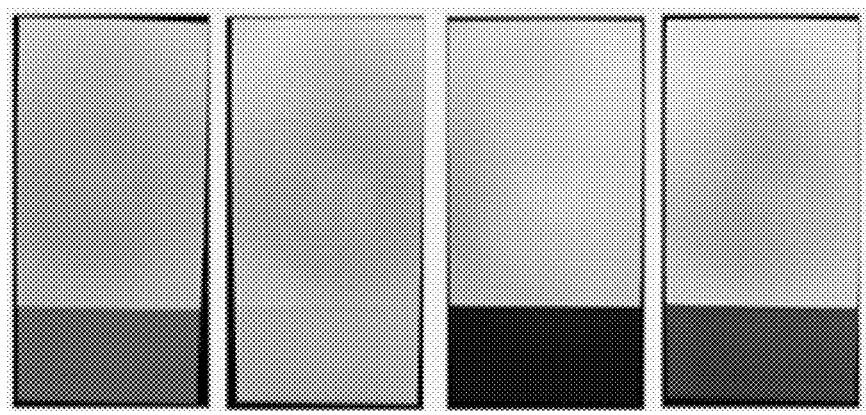
FIG. 4 is a schematic diagram of a light-on test under different display frames according to the embodiment of the present disclosure.

1. An AMOLED GAT Short type abnormal display phenomenon (ET light-on phenomenon). FIG. 4 shows the ET light-on phenomenon of GAT Short type abnormal display. The figure shows, from left to right, a red frame, a green frame, a blue frame and a gray frame, that is, penetrability-defective split screens appearing on fixed positions of each color frame by loading red, green, blue and gray monochrome frames on the display panel. However, the brightness of the screen is still controlled by DC signals (such as a Vdd signal, a Vss signal, a Vdata signal and a Vinit signal), but after the adjustment of an AC signal, the screen phenomenon changes, which indicates that the phenomenon is related to GOA driving, 2. Analysis of a GAT Short type abnormal display product-1. An abnormal display panel is analyzed. The previous step indicates that GOA is strongly related to the defect. Therefore, the GOA signals are respectively cut off to confirm whether the phenomenon of the panel has changed. Before the panel is processed, the panel shows half-screen abnormal display, and when an EM GOA signal on the left part of the panel is cut off and the panel is driven only by the EM GOA signal on the right part of the panel, the screen changes to normal full-screen display, which indicates that the defect is strongly related to EM GOA.

3. Analysis of a GAT Short type abnormal display product-2. It is found by locating EMMI hot spots on an EM GOA that abnormal bright spots, that is, hot spots, are detected at a corner of an EM GOA capacitance storage. It is confirmed through FIB cross sectioning that there has been the phenomenon of the short between GAT1 and GAT2. It is found at the short that the GI1 crack is caused by the excessively large GAT1 profile, and the slope angle is >75°. However, slope angles of monitored positions of mass products in the same period are <60°, indicating that the uniformity of the display panel is not easily ensured or not easily monitored by a test process.

The embodiments of the present disclosure have the following beneficial effects: the array substrate provided by the embodiment of the present disclosure includes the capacitor, the capacitor includes the first electrode, the dielectric portion and the second electrode sequentially located on the base substrate the dielectric portion includes: the first plane facing the second electrode, and the first slope surface and the orthographic projection, on the base substrate, of the second electrode is only located in the region where the orthographic projection, on the base substrate, of the first plane is located. That is, the slope angle that the first electrode needs to form during conventional etching is less than 50 degrees, but it is not easily ensured that the slope angle formed by the first electrode of the capacitor is less than 50 degrees in an actual production process. If the formed slope angle is too large, the dielectric portion on the first electrode will crack at the first slope surface, and the crack of the dielectric portion at the first slope surface will further lead to a short between the first electrode and the second electrode, causing abnormal display. In the embodiments of the present disclosure, the area of the second electrode is made smaller, the orthographic projection, on the base substrate, of the second electrode is only located in the region where the orthographic projection, on the base substrate, of the first plane is located, and the range of the second electrode terminates before the first slope surface of the dielectric portion, so there will be no short between the first electrode and the second electrode at the first slope surface, thereby fundamentally relieving the problem that the capacitor produced in the related art may cause the problem of abnormal display of the display panel.

Moreover, the orthographic projection, on the base substrate, of the second electrode is only located in the region where the orthographic projection, on the base substrate, of the first plane is located, which may further improve a withstand voltage margin that the capacitor can withstand due to avoiding T-aging, that is, relieve the problem that the conventional capacitor can easily break down weak positions of the first electrode and the second electrode in the capacitor structure due to too high T-aging voltage, causing a limited withstand voltage margin.

Obviously, those skilled in the art can make various modifications and variations to the present disclosure without departing from the spirit and scope of the present disclosure. Thus, if such modifications and variations of the present disclosure fall within the scope of the claims of the present disclosure and the equivalent technologies thereof, the present disclosure is also intended to cover such modifications and variations.

What is claimed is:

1. An array substrate, comprising:
   a base substrate; and
   a capacitor;
   wherein the capacitor comprises a first electrode, a dielectric portion and a second electrode sequentially located on the base substrate;
      wherein the dielectric portion comprises:
         a first plane facing the second electrode; and
         a first slope surface extending from the first plane to the base substrate; and
         an orthographic projection, on the base substrate, of the second electrode is completely covered by an orthographic projection, on the base substrate, of the first plane of the dielectric portion; and the orthographic projection, on the base substrate, of the second electrode is completely covered by an orthographic projection, on the base substrate, of the first electrode;
      wherein the second electrode comprises:
         a second plane facing the dielectric portion; and
         a second slope surface connected to the second plane;
         wherein an included angle between the second slope surface and the second plane is an acute angle; and
         an orthographic projection, on the base substrate, of the second plane of the second electrode falls within a region where the orthographic projection, on the base substrate, of the first plane of the dielectric portion is located;
         wherein the second electrode further comprises a second electrode top plane facing away from the dielectric portion; and wherein an area of the second plane is greater that an area of the second electrode top plane.

2. The array substrate according to claim 1, wherein an orthographic projection, on the base substrate, of the dielectric portion completely covers the orthographic projection, on the base substrate, of the first electrode.

3. The array substrate according to claim 2, wherein the first electrode comprises:
   a third plane facing the dielectric portion;
   wherein the orthographic projection, on the base substrate, of the second plane of the second electrode falls within a region where an orthographic projection, on the base substrate, of the third plane of the first electrode is located.

4. The array substrate according to claim 3, wherein the first electrode further comprises:
   a fourth plane facing the base substrate; and
   a third slope surface connected with the fourth plane and the third plane;
   wherein an included angle between the third slope surface and the fourth plane ranges from 50 degrees to 90 degrees.

5. The array substrate according to claim 1, wherein the array substrate comprises a gate drive circuit; and the gate drive circuit comprises the capacitor.

6. The array substrate according to claim 1, wherein the array substrate comprises a pixel circuit; and the pixel circuit comprises the capacitor.

7. The array substrate according to claim 1, wherein the array substrate comprises:
   a first gate metal layer, a gate insulating layer and a second gate metal layer sequentially located on the base substrate;
   wherein a layer where the first electrode is located is same as a layer where the first gate metal layer is located, a layer where the dielectric portion is located is same as a layer where the gate insulating layer is located, and a layer where the second electrode is located is same as a layer where the second gate metal layer is located.

8. A display panel, comprising an array substrate, wherein the array substrate comprises:
   a base substrate; and
   a capacitor;
   wherein the capacitor comprises a first electrode, a dielectric portion and a second electrode sequentially located on the base substrate;
      wherein the dielectric portion comprises:
         a first plane facing the second electrode; and
         a first slope surface extending from the first plane to the base substrate; and
         an orthographic projection, on the base substrate, of the second electrode is completely covered by an orthographic projection, on the base substrate, of the first plane of the dielectric portion; and the orthographic projection, on the base substrate, of the second electrode is completely covered by an orthographic projection, on the base substrate, of the first electrode;
      wherein the second electrode comprises:
         a second plane facing the dielectric portion; and
         a second slope surface connected to the second plane;
         wherein an included angle between the second slope surface and the second plane is an acute angle; and
         an orthographic projection, on the base substrate, of the second plane of the second electrode falls within a region where the orthographic projection, on the base substrate, of the first plane of the dielectric portion is located;
         wherein the second electrode further comprises a second electrode top plane facing away from the dielectric portion; and wherein an area of the second plane is greater that an area of the second electrode top plane.

9. A display device, comprising the display panel according to claim 8.

10. The display panel according to claim 8, wherein an orthographic projection, on the base substrate, of the dielectric portion completely covers the orthographic projection, on the base substrate, of the first electrode.

11. The display panel according to claim 10, wherein the first electrode comprises:
   a third plane facing the dielectric portion;
   wherein the orthographic projection, on the base substrate, of the second plane of the second electrode falls within a region where an orthographic projection, on the base substrate, of the third plane of the first electrode is located.

12. The display panel according to claim 11, wherein the first electrode further comprises:
   a fourth plane facing the base substrate; and
   a third slope surface connected with the fourth plane and the third plane;
   wherein an included angle between the third slope surface and the fourth plane ranges from 50 degrees to 90 degrees.

13. The display panel according to claim 8, wherein the array substrate comprises a gate drive circuit; and the gate drive circuit comprises the capacitor.

14. The display panel according to claim 8, wherein the array substrate comprises a pixel circuit; and the pixel circuit comprises the capacitor.

15. The display panel according to claim 8, wherein the array substrate comprises:
   a first gate metal layer, a gate insulating layer and a second gate metal layer sequentially located on the base substrate;
   wherein a layer where the first electrode is located is same as a layer where the first gate metal layer is located, a layer where the dielectric portion is located is same as a layer where the gate insulating layer is located, and a layer where the second electrode is located is same as a layer where the second gate metal layer is located.

* * * * *